United States Patent [19]

Matsui

[11] Patent Number: 4,823,171
[45] Date of Patent: Apr. 18, 1989

[54] COMPOUND SEMICONDUCTOR DEVICE

[75] Inventor: Yuichi Matsui, Osaka, Japan

[73] Assignee: Sumitomo Electric Industries, Ltd., Osaka, Japan

[21] Appl. No.: 32,765

[22] Filed: Mar. 31, 1987

[30] Foreign Application Priority Data

Apr. 5, 1986 [JP] Japan .................................. 61-78499

[51] Int. Cl.$^4$ ........................................... H01L 27/12
[52] U.S. Cl. .......................................... 357/4; 357/22; 357/4
[58] Field of Search ..................... 357/22 A, 4 SL, 16, 357/22 I

[56] References Cited

U.S. PATENT DOCUMENTS

| | | | |
|---|---|---|---|
| 4,424,525 | 1/1984 | Mimura | 357/22 A |
| 4,471,367 | 9/1984 | Chen | 357/22 A |
| 4,607,272 | 8/1986 | Osburn | 357/452 |
| 4,652,896 | 3/1987 | Das | 357/22 A |
| 4,663,643 | 5/1987 | Mimura | 357/22 A |
| 4,665,415 | 3/1987 | Esaki | 357/22 A |
| 4,672,406 | 6/1987 | Sawada | 357/22 A |

Primary Examiner—Martin H. Edlow
Attorney, Agent, or Firm—Kenyon & Kenyon

[57] ABSTRACT

A compound semiconductor device having a channel layer which is fabricated by alternately laminating an $In_xGa_{1-x}As$ compound semiconductor layer ($0.7 \leq x \leq 1.0$) with thickness of 16 atomic planes or less, and an $In_yGa_{1-y}As$ compound semiconductor layer ($0 \leq y \leq 0.3$) with thickness of 14 atomic planes or less, so that the thickness of the former is greater than that of the latter, in which n-type impurities are doped only in the $In_yGa_{1-y}As$ layer ($0 \leq y \leq 0.3$) side, and a ratio In/Ga on the whole is set at 1.1 or higher.

5 Claims, 3 Drawing Sheets

X: DIRECTION PARALLEL TO THE
   INTERFACE OF InAs AND GaAs
Y: DIRECTION VERTICAL TO THE
   INTERFACE OF InAs AND GaAs

X: DIRECTION PARALLEL TO THE
   INTERFACE OF InAs AND GaAs
Y: DIRECTION VERTICAL TO THE
   INTERFACE OF InAs AND GaAs

•——• IN THE ABSENCE OF
     LATTICE MISMATCHING
     TRANSITION, ETC.

o--o IN THE PRESENCE OF
     LATTICE MISMATCHING
     TRANSITION, ETC.

COMPOUND SEMICONDUCTOR DEVICE

BACKGROUND OF THE INVENTION

This invention relates to a compound semiconductor device, and more particularly to a novel compound semiconductor device increased in the electron mobility, by alternately laminating $In_xGa_{1-x}As$ layer ($0.7 \leq x \leq 1.0$) and $In_yGa_{1-y}As$ layer ($0 \leq y \leq 0.3$) which differ significantly in the lattice constant, and doping n-type impurities only into the $In_yGa_{1-y}As$ layer ($0 \leq y \leq 0.3$), so as to realize a structure different from the existing lattice-matched alternate laminating structure of GaAs and GaAlAs or GaAs and AlAs (in both pairs, the lattice mismatching is about less than 0.3%; the lattice mismatching (%) is defined as {[(lattice constant of GaAlAs or AlAs)−(lattice constant of GaAs)]×100}/(lattice constant of GaAs)].

As fabricating method of compound semiconductor devices, particularly electronic devices, the epitaxial growth method is generally employed owing to the thin and uniform growth of layer and ease of control of constituent element composition ratio. Above all, the molecular beam epitaxial (MBE) growth method is known as one of the particularly noticed techniques recently. For example, a device utilizing the MBE growth method and thin layer periodic structure is described in details by W. T. Tsang in Nikkei Electronics No. 308, 163 (1983).

According to this MBE growth method, the crystal growth speed can be controlled on a single atomic plane level (see J. P. van der Ziel et al., J. Appl. Phys., 48 (1977), p. 3018), and, furthermore, when combined with the reflective electron diffraction method, the composition of one atomic plane can be accurately controlled (see J. H. Neave et al., Appl. Phys. A 31, 1, 1983).

By employing such MBE growth method, it is possible to fabricate a high electron mobility transistor (HEMT) as shown in FIG. 3.

Incidentally, microwave elements using conventional compound semiconductors are disclosed, for example, in the Japanese Unexamined Patent Publication Nos. 4085/1984 and 147169/1983.

In the HEMT structure shown in FIG. 3, a GaAs layer 12 functioning as a buffer layer is formed on a semi-insulating GaAs substrate 11, and an undoped GaAs layer 13 serving as a channel layer is formed thereon. On the undoped GaAs layer 13 is formed an electron supply layer 14 having a high impurity concentration such as $n-Ga_xAl_{1-x}As$, and in the middle of the electron supply layer 14 there is a layer 15 made of a semiconductor containing p-type impurities at high concentration and possessing a large electrophilic ability, while a gate electrode 16 is disposed on this layer 15. Furthermore, the surface region 17 of the electron supply layer 14 at both sides of the layer 15 is alloyed, and a source electrode 18 and a drain electrode 19 are formed thereon.

In thus composed semiconductor device, when a proper bias voltage is applied to the gate electrode 16, a two-dimensional electron gas 20 is formed at the channel layer 13 side at the interface of the electron supply layer 14 and the channel layer 13. As a result, many electrons flow in the portion of a few tens angstrom units in thickness near the interface in the channel layer 13 where only few impurity ions are present. Therefore, scatter of impurity ions which is one of major causes of limiting the electron mobility is less, so that a high electron mobility may be realized.

The constitution in FIG. 3 makes use of the electron storage layer at the single hetero interface of GaAs layer and GaAlAs layer, whereas examples of making use of plural hetero interface of GaAs layer and GaAlAs layer by forming a multi-layer structure by alternately laminating GaAs layer and GaAlAs layer are described in details by R. Dingle et al. in Appl. Phys. Lett., 33, 665 (1978), and by T. J. Drumond et al., in J. Appl. Phys., 53 (2), 1023 (1982), and others.

In such compound semiconductor device, however, since the primary object lies in satisfaction of lattice matching condition on the hetero interface, that is, to control the lattice mismatching under 0.3%, there is a certain limit in increasing the degree of energy discontinuity at the hetero interface. For example, the relation between energy gap and lattice constant about generally known compound semiconductors is shown in FIG. 4. At the present, since only GaAs substrate and InP substrate are present as the semi-insulating compound semiconductor substrates, in order to match the lattice constant on the interface of the substrate and the epitaxial layer and on the hetero interface of the channel layer and the electron supply layer, conventionally, GaAs channel layer and $Ga_xAl_{1-x}As$ or AlAs electron supply layer are formed on GaAs substrate, or $In_{0.53}Ga_{0.47}As$ channel layer and $In_{0.52}Al_{0.48}As$ supply layer are formed on InP substrate. In such structures, however, the difference of energy gap on the hetero interface between the channel layer and the electron supply layer is only about 0.7 eV at most (when using GaAs as the channel layer and AlAs as the electron supply layer). Still more, when the AlAs layer is doped with Si, a deep impurity level occurs, and in the structure as shown in FIG. 3, the composition rate y in $Ga_yAl_{1-y}As$ is usually selected somewhere between 0.7 and 0.8. Actually, accordingly, the energy gap difference on the hetero interface between the channel layer (GaAs layer) and the electron supply layer ($Ga_yAl_{1-y}As$ layer) is only about 0.2 eV.

Hence, in the conventional structure, if the lattice matching condition is satisfied on the interface between the semi-insulating substrate and the epitaxial layer and the hetero interface between the channel layer and the electron supply layer, it is evident that the degree of energy discontinuity is significantly limited. According to FIG. 4, aside from the combinations of GaAs-GaAlAs (or AlAs) and $In_{0.53}Ga_{0.47}As$-$In_{0.52}Al_{0.84}As$, it may be possible to use InP substrate, employing $In_{0.53}Ga_{0.47}As$ layer as the channel layer and employing, for example, $AlAs_xSb_{1-x}$ having a large energy gap difference from $In_{0.53}Ga_{0.47}As$ as the electron supply layer. But, generally, it is technically difficult to develop MBE growth of mixed crystal containing two elements of group V, and, still worse, since the compound $AlAs_xSb_{1-x}$ contains two elements, Al and Sb, which are easily oxidized, it is difficult to obtain a layer of high purity (the purity before Si doping), and handling of fine processing after growth is difficult. Not only $AlAs_xSb_{1-x}$ layer, but also three-element mixed crystal or four-element mixed crystal such as $In_{0.53}Ga_{0.47}As$ or $In_{0.52}Al_{0.48}As$ is generally complicated in composition control for lattice matching, and the growth technology is extremely difficult, which may bring about new problems, such as poor reproducibility and difficulty in unifying the composition distribution within wafer plane. Therefore, as the combination of two-element compound satisfying the lattice matching condition on the interface between the semi-insulating substrate and the epitaxial layer and on the hetero interface between the channel layer and the epitaxial layer, GaAs-AlAs (or $Ga_xAl_{1-x}As$) is studied predominantly. As for $Ga_xAl_{1-x}As$, as clear from FIG. 4, since the lattice mismatching between GaAs and AlAs is very small, about 0.3%, the lattice matching condition with GaAs is satisfied regardless of the composition rate x of $Ga_xAl_{1-x}As$, so that strict composition control is not required as compared with such combinations as $In_xGa_{1-x}As$-$In_xAl_{1-x}As$ etc. Hence, growth technology is not so difficult. However, in the combination of GaAs-$Ga_xAl_{1-x}As$ (x=0.7 to 0.8), as mentioned above, the energy gap difference is limited up to about 0.2 eV. Thus, smallness of energy gap difference, that is, smallness of degree of energy discontinuity on the hetero interface induces to decrease the effect of electron confinement in the two-dimensional electron gas layer mentioned above, to lower the degree of formation of two-dimensional electron gas at room temperature, and to lower the electron mobility on the hetero interface.

In such conventional structure, the fact that the electron mobility in the two-dimensional gas layer decreases suddenly as approaching from low temperature to room temperature is described in details by T. J. Drummond et al., J. Appl. Phys., 53 (1982), 1023, and others.

BRIEF SUMMARY OF THE INVENTION

This invention is contrived in the light of the above problems, it is hence a primary object of this invention to present a compound semiconductor device capable of forming a hetero interface having a high electron mobility even at room temperature, by restricting the decrease of effect of electron confinement into two-dimensional gas layer at room temperature.

To achieve said object, the compound semiconductor device of this invention possesses a channel layer increased in the probability of existence of electrons at the side of $In_xGa_{1-x}As$ compound semiconductor layer ($0.7 \leq x \leq 1.0$), by alternately laminating $In_xGa_{1-x}As$ compound semiconductor layer ($0.7 \leq x \leq 1.0$) with thickness of 16 atomic planes or less and $In_yGa_{1-y}As$ compound semiconductor layer ($0 \leq y \leq 0.3$) with thickness of 14 atomic planes or less, so that the thickness of the former is greater than that of the latter, and by doping n-type impurities only to the $In_yGa_{1-y}As$ layer ($0 \leq y \leq 0.3$) side.

In the above channel layer, on the whole, the ratio of In to Ga, In/Ga, should be preferably 1.1 or more.

Besides, this channel layer may be formed on a semi-insulating GaAs substrate or semi-insulating InP substrate as the substrate of a compound semiconductor device, and the lower most layer of the channel layer may be an $In_yGa_{1-y}As$ compound semiconductor layer ($0 \leq y \leq 0.3$) with thickness of 14 atomic planes or less.

In the compound semiconductor device thus composed, without admitting the lattice mismatching transition, not only the $In_xGa_{1-x}As$ compound semiconductor layer ($0.7 \leq x \leq 1.0$) and $In_yGa_{1-y}As$ compound semiconductor layer ($0 \leq y \leq 0.3$) can be alternately laminated, but also the energy gap is increased, so that a high electron mobility can be achieved.

More specifically, by employing the MBE growth method or organic metal vapor phase growth method or the like, a compound semiconductor thin films differing in lattice constant can be grown epitaxially without admitting defects, such as transition, etc. within the thin films (see M. J. Ludowise et al., A. P. L. 42 (1983), 487, or G. C. Osbourn et al., A. P. L., 41 (1982), 172).

Based on the above knowledge, the present inventor completed this invention by the following thinking.

For example, lattice mismatching of InAs (in case x=1 in $In_xGa_{1-x}As$) and GaAs (in case y=0 in $In_yGa_{1-y}As$) is about 7%, and in the case of such combination, as far as the thickness of each is up to about 50 Å (in terms of the number of atomic planes, about 18 atomic planes in GaAs, and about 16 atomic planes in InAs), InAs and GaAs may be alternately laminated without admitting lattice mismatching dislocation. About this fact, by observing by a transmission type electron microscope in a state of forming a multi-layer periodic structure of InAs and GaAs by increasing the thickness of InAs greater than 16 atomic planes and that of GaAs greater than 18 atomic planes, occurrence of dislocation based on lattice mismatching has been confirmed, and, to the contrary, in a state of forming a multi-layer periodic structure with smaller thickness than stated above, absence of dislocation based on lattice mismatching has been confirmed.

Generally, moreover, in the presence of lattice defects such as dislocation etc., electric characteristics and optical characteristics of crystal are extremely deteriorated, and also in the electric characteristics of the multi-layer periodic structures fabricated by the present inventor, the electric characteristics of the sample having dislocation based on lattice mismatching have been confirmed to be inferior to the electric characteristics of the sample without dislocation based on lattice mismatching.

Since the lattice constant of InAs (approx. 6.05 Å) is greater than that of GaAs (approx. 5.65 Å), near the interface of InAs and GaAs, the atomic configuration in the InAs crystal has a structure as shown in FIG. 5 (b) because of elastic distortion, different from the original structure free from elastic distortion as shown in FIG. 5 (a). Accordingly, by alternately laminating thin film layers of InAs layer and GaAs layer, and forming a structure in which n-type impurities are doped only in the GaAs side, the probability of existence of electrons at the InAs layer side where crystal lattice is elastically deformed tetragonally is increased on the interface of InAs-GaAs. What is more, as clear from FIG. 4, the difference of energy gap between GaAs and InAs is about 1.0 eV, which is greater than the energy gap difference between GaAs and AlAs. Therefore, the decrease of effect of electron confinement into the InAs layer is notably restrained as compared with the case of combination of GaAs-AlAs. That is, at the InAs side where elastically deformed tetragonally, the probability of existence of electrons can be increased. The energy gap difference of InAs and GaAs is greater than that of conventional GaAs and $Ga_xAl_{1-x}As$, and even at room temperature, the probability of existence of electrons in the InAs layer is greater, so that the electron mobility is increased.

Furthermore, on the interface of InAs-GaAs, since the InAs layer is tetragonally deformed due to elastic distortion as shown in FIG. 5 (b), for the electrons advancing in the X-direction in the InAs layer, the degree of lattice scattering due to thermal vibration of atoms may be controlled smaller than in the case of FIG. 5 (a) free from elastic distortion. As a result, the lattice scattering which is a scattering mechanism of electrons at room temperature may be also decreased.

By nature, the electron mobility at room temperature in GaAs crystal and InAs crystal is greater in the InAs crystal, but as the InAs crystal is tetragonally deformed due to elastic distortion as mentioned above, the mobility at room temperature of electrons advancing in the X-direction in the tetragonally deformed InAs layer is greater as compared with the original InAs crystal free from tetragonal deformation. Therefore, as compared with the conventional compound semiconductor device, a faster operating compound semiconductor device can be realized. Meanwhile, such compound semiconductor device fabricated by alternately laminating thin film layers of InAs layer and GaAs layer, and doping n-type impurities only at GaAs layer side to form a channel layer has not been present so far.

The same holds true with the structure in which InAs layer is replaced by $In_xGa_{1-x}As$ layer $(0.7 \leq x \leq 1.0)$ and GaAs layer is replaced by $In_yGa_{1-y}As$ layer $(0 \leq y \leq 0.3)$. In this case, the difference of energy gap between $In_xGa_{1-x}As$ layer $(0.7 \leq x \leq 1.0)$ and $In_yGa_{1-y}As$ $(0 \leq y \leq 0.3)$ is similar to or greater than the energy gap difference of $In_{0.53}Ga_{0.47}As$ and $In_{0.52}Al_{0.48}As$.

Besides, this inventor discovered that the electric characteristics could be improved by setting the ratio of In to Ga in the entire channel structure composed of the multi-layer periodic structure stated above, In/Ga, at 1.1 or more. This fact has been found on the basis that, when the electric characteristics were measured by fabricating a compound semiconductor device by variously changing the ratio of In to Ga in the entire channel layer above, the electric characteristics were better when the ratio In/Ga was 1.1 or more than when it was less than 1.1.

BRIEF DESCRIPTION OF THE DRAWINGS

FIG. 5 (b) is an outline drawing of crystal structure tetragonally deformed due to elastic distortion.

DETAILED DESCRIPTION OF THE PREFERRED EMBODIMENTS

Figure 1:
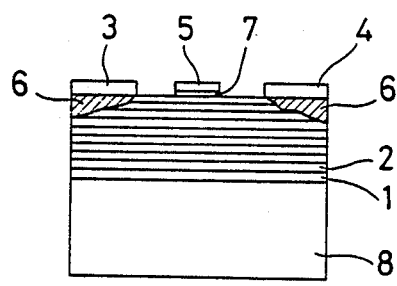
FIG. 1 is an outline sectional view of field effect transistor (FET) as an embodiment of compound semiconductor device of this invention.

Referring now to the drawings, the present invention is described in details hereinafter.

FIG. 1 is a sectional view illustrating the FET as an embodiment of a compound semiconductor device by this invention.

The FET shown in FIG. 1 possesses a channel layer in a structure in which InAs layer (3 atomic planes thick) 1 and GaAs layer (1 atomic plane thick) 2, which are formed by MBE growth method, are alternately laminated on a semi-insulating InP substrate 8. Here, 1 atomic plane thickness means the distance between lattice planes where group III atoms (Ga, In, etc.) are present.

In the GaAs layer, Si is doped as an n-type impurity. The number of layers laminated is 150 for both InAs layer and GaAs layer, and the thickness of channel layer is about 0.18 μm. The mean carrier density of the entire channel layer was selected somewhere between approx. $1 \times 10^{17}$ cm$^{-3}$ to $5 \times 10^{17}$ cm$^{-3}$.

Figure 2:
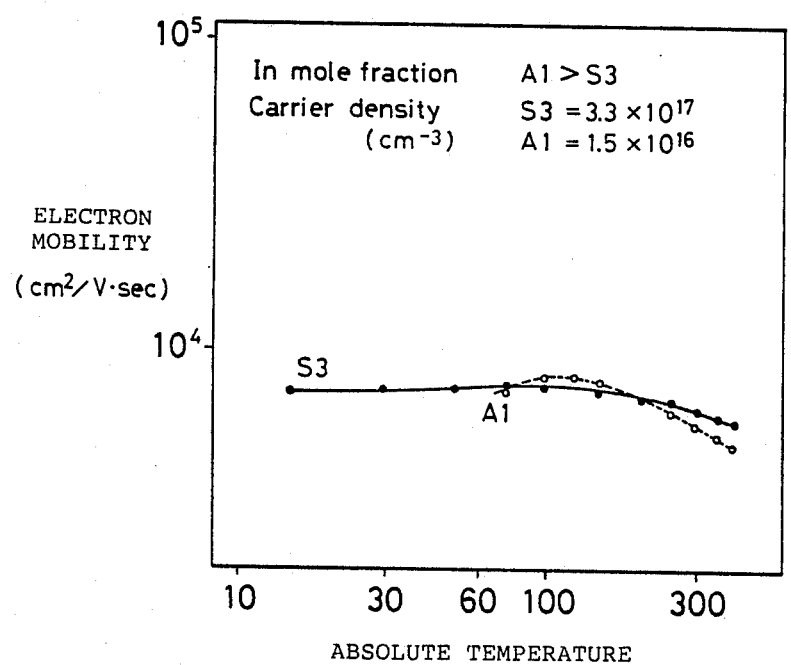
FIG. 2 is a diagram showing the results of measurement of temperature dependence of electron mobility of channel layer by this invention, in comparison with mixed crystal.
Figure 3:
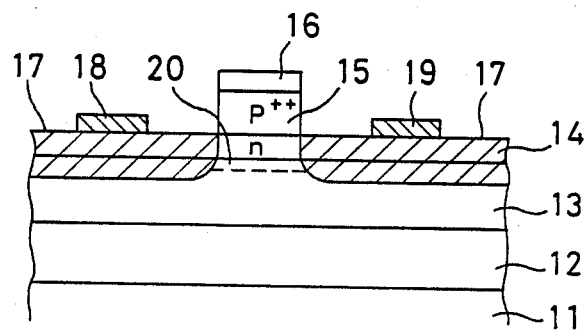
FIG. 3 is an outline sectional view of a conventional high electron mobility FET.
Figure 4:
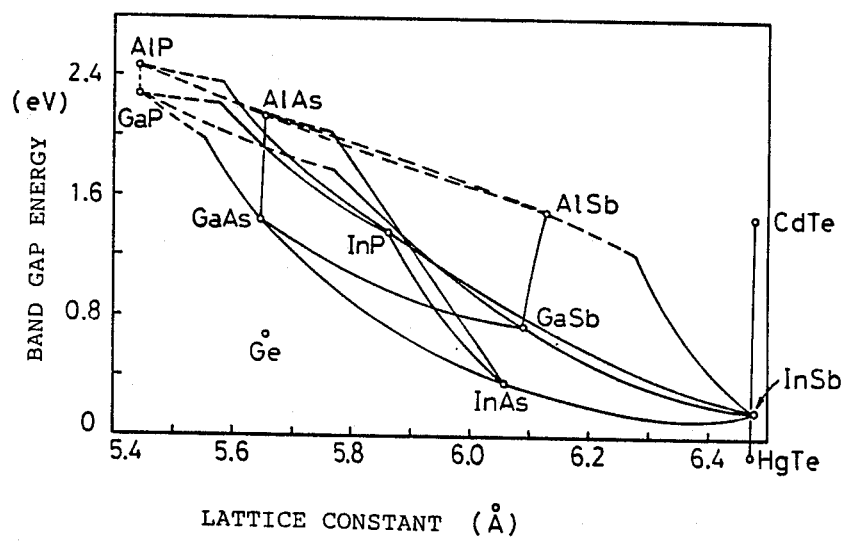
FIG. 4 is a diagram to explain the relation between energy gap and lattice constant in conventional compound semiconductor.

FIG. 2 shows the results of measurement relating to temperature dependency of electron mobility of this channel layer (sample S3).

For reference, the electron mobility of an $In_xGa_{1-x}As$ mixed crystal $(x \geq 0.8)$ of which In composition is greater than sample S3 was also measured (sample A1). As evident from FIG. 2, in low temperature region, although the electron mobility of sample S3 is smaller than that of sample A1, in high temperature region, to the contrary, the electron mobility of sample S3 is greater than that of sample A1. Generally, furthermore, when the In composition is higher, the electron mobility in high temperature region should be greater, but the In composition of sample S3 is lower than that of sample A1. This seems because the degree of scattering due to thermal vibration of atoms is smaller by periodic structure as in sample S3 as the scattering factor on electrons predominant in the high temperature region is due to thermal vibration of atoms. In sample S3, moreover, when it is considered that the probability of existence of electrons is high in the InAs layer it is assumed that the mobility of sample S3 may be greater than the electron mobility estimated from the mean In composition of channel layer.

Figure 6:
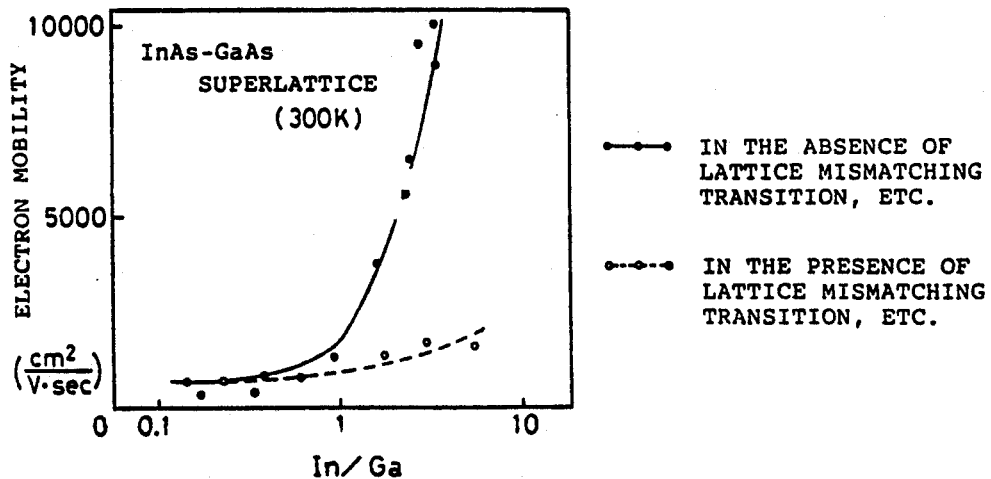
FIG. 6 is a diagram showing the result of measurement of relation between electron mobility and ratio In/Ga of InAs-GaAs super lattice.

Incidentally, by fabricating an InAs-GaAs super-lattice on an InP substrate while doping Si only in the GaAs side, the ratio of In to Ga, In/Ga, was varied, and the electron mobility was measured by Hall method, of which results are shown in FIG. 6, and it is known that the electron mobility is increased suddenly by setting this ratio at 1.1 or more. When the electron mobility can be increased, the operating speed of the FET can be increased, too. When the thickness of InAs was controlled under 16 atomic planes and that of GaAs under 14 atomic planes, the generation of crystal defects such as lattice mismatched dislocation were not observed, and when the ratio was over 1.1, a high electron mobility was attained, but when the thickness was over 17 atomic planes of InAs and 19 atomic planes of GaAs, respectively, lattice mismatching dislocation occurred, and the electron mobility was lowered. When the thickness of the latter was 15 to 18 atomic planes, when the ratio was set over 1.1, the thickness of InAs became 17 to 20 atomic planes or more, and lattice mismatching dislocation occurred inside the InAs layer, and the electron mobility was lowered.

On the outermost surface of sample fabricated by MBE growth, a source electrode 3 and drain electrode 4 are disposed so as to form an ohmic junction against the channel layer, by using AuGeNi alloy. To form an ohmic junction, after evaporating AuGeNi alloy, the alloy was heated at 400° C. At this time, atoms of Au and Ge diffused within the channel layer, and in this diffused region 6, the periodic structure of InAs and GaAs was broken and a mixed crystal was formed, so that an ohmic junction could be formed easily. Such phenomenon of mixed crystal due to breakage of periodic structure composed of thin film layers by partial selective diffusion was described in details by N. Holonyak et al., A. P. L., 39 (1981), 102, and others. Furthermore, after forming an oxide film 7 partially on the outermost surface of the sample fabricated by MBE growth, by evaporating Al, a gate electrode 5 is disposed on the outermost surface of the sample. But the gate electrode forming method is not limited to this, and any known method may be employed.

Figure 5A:
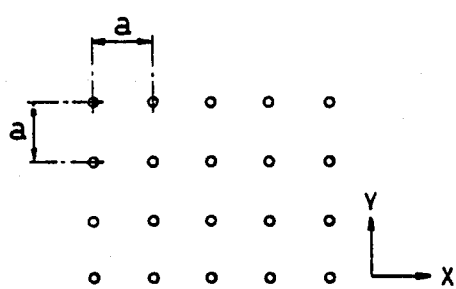
FIG. 5 (a) is an outline drawing of conventional crystal structure (cubic crystal) free from elastic distortion.
Figure 5B:
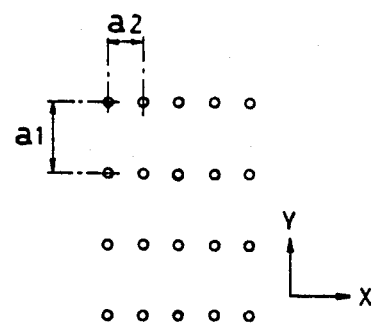

In thus composed FET structure, the InAs layer has its crystal structure elastically deformed tetragonally as shown in FIG. 5 (b), and a greater energy discontinuity is present on the interface of InAs and GaAs, than on the conventional GaAs-$Ga_xAl_{1-x}As$ system, and also the probability of existence of electrons in the InAs layer can be heightened than that in the GaAs layer because only the GaAs layer is doped with Si. In such FET structure, by controlling the voltage applied to the gate electrode, the degree of depletion of channel layer of about 0.18 μm thickness under the gate electrode can be controlled, and the characteristics in high electric field application or at room temperature are superior in this FET, as compared with the FET using the conventional GaAs-$Ga_xAl_{1-x}As$ system.

In the embodiment shown in FIG. 1, the lowermost layer of the channel layer is the InAs layer 1, but when the channel layer is formed by using GaAs layer as the lowermost layer, the flatness of the outermost surface of the channel layer is improved, and a gate electrode with excellent Schottky characteristics may be obtained.

In this embodiment, only FET is explained, but it is evident that this invention may be also applied to other compound semiconductor devices having such channel layer as HEMT etc.

What is claimed is:

1. A compound semiconductor device having a channel layer, said channel layer having an increased probability of existence of electrons in a $In_xGa_{1-x}As$ layer ($0.7 \leq x \leq 1.0$) of said channel layer, said device having alternate laminations of $In_xGa_{1-x}As$ semiconductor layers ($0.7 \leq x \leq 1.0$) with thicknesses of 16 atomic planes or less and $In_yGa_{1-y}As$ layers ($0 \leq y \leq 0.3$) with thicknesses of 14 atomic planes or less so that the thickness of the $In_xGa_{1-x}As$ ($0.7 \leq x \leq 1.0$) is greater than that of the thickness of the $In_{ny}Ga_{1-y}As$ layer ($0 \leq y \leq 0.3$), and wherein n-type impurities are doped only in the $In_yGa_{1-y}As$ layer ($0 \leq y \leq 0.3$).

2. A compound semiconductor device as set forth in claim 1, wherein a ratio of In/Ga in the entire channel layer is 1.1 or more.

3. A compound semiconductor device as set forth in claim 1, wherein the channel layer is formed on a semi-insulating GaAs substrate.

4. A compound semiconductor device as set forth in claim 1, wherein the channel layer is formed on a semi-insulating InP substrate.

5. A compound semiconductor device as set forth in claim 1, wherein a lowermost layer of the channel layer is said $In_yGa_{1-y}As$ layer ($0 \leq y \leq 0.3$) with a thickness of 14 atomic planes or less.

* * * * *